United States Patent [19]

Honjo et al.

[11] Patent Number: 4,929,997
[45] Date of Patent: May 29, 1990

[54] HETEROJUNCTION BIPOLAR TRANSISTOR WITH BALLISTIC OPERATION

[75] Inventors: Kazuhiko Honjo; Shin-Ichi Tanaka, both of Tokyo, Japan

[73] Assignee: NEC Corporation, Tokyo, Japan

[21] Appl. No.: 136,589

[22] Filed: Dec. 22, 1987

[30] Foreign Application Priority Data

Dec. 22, 1986 [JP] Japan ............................... 61-307044
Jun. 2, 1987 [JP] Japan ............................... 62-139154
Jun. 24, 1987 [JP] Japan ............................... 62-158100
Jun. 24, 1987 [JP] Japan ............................... 62-158101

[51] Int. Cl.$^5$ ............................................ H01L 29/72
[52] U.S. Cl. ........................................ 357/34; 357/16; 357/37
[58] Field of Search ................. 357/34, 16, 37, 34 HB

[56] References Cited

U.S. PATENT DOCUMENTS 4,719,496 1/1988 Capasso et al. ................... 357/16 X
4,794,440 12/1988 Capasso et al. ................... 357/16 X

FOREIGN PATENT DOCUMENTS

58-114455 7/1983 Japan ............................... 357/34 HB
60-010775 1/1985 Japan ............................... 357/34 HB
60-242671 12/1985 Japan ............................... 357/34 HB
61-039576 2/1986 Japan ............................... 357/34 HB
62-085465 4/1987 Japan ............................... 357/34 HB Primary Examiner—Andrew J. James
Assistant Examiner—Sara W. Crane
Attorney, Agent, or Firm—Sughrue, Mion, Zinn, Macpeak & Seas

[57] ABSTRACT

For improvement in operation speed, there is provided a heterojunction bipolar transistor comprising, (a) an emitter region formed of a first semiconductor material of a first conductivity type, (b) a base region formed of a second semiconductor material of a second conductivity type opposite to the first conductivity type and forming a first junction together with the emitter region, and (c) a collector region formed of a third semiconductor material of the first conductivity type and forming a second junction together with the base region, the heterojunction bipolar transistor has a plurality of abrupt potential discontinuities including first and second abrupt potential discontinuities produced in succession to provide kinetic energies to a carrier injected from the emitter region, respectively, and the first abrupt potential discontinuity is produced at one of the first and second junctions, thereby allowing the carrier to move over a distance longer than a mean free path of the carrier in the ballistic manner.

22 Claims, 6 Drawing Sheets

FIG. 1
PRIOR-ART

FIG. 2
PRIOR-ART

HETEROJUNCTION BIPOLAR TRANSISTOR WITH BALLISTIC OPERATION

FIELD OF THE INVENTION

This invention relates to a heterojunction bipolar transistor with ballistic operation and, more particularly, to a heterojunction bipolar transistor having a base region or a collector region with a plurality of potential discontinuities each accelerating injected carriers.

BACKGROUND OF THE INVENTION

Figure 1:
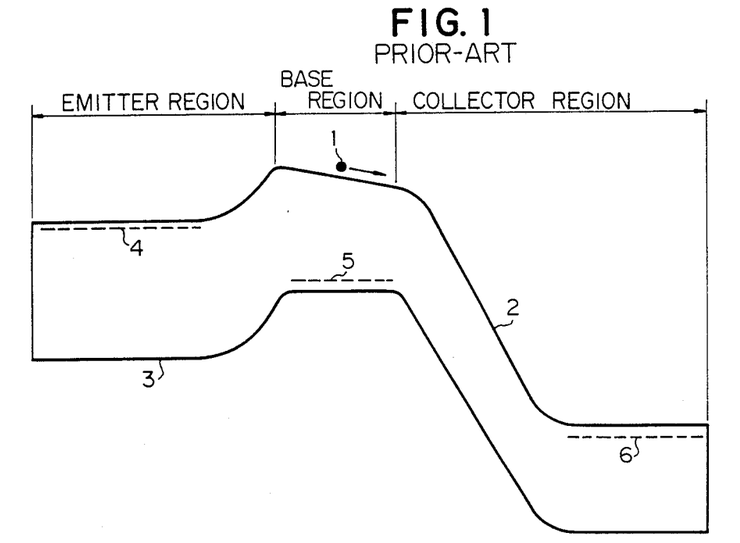
FIG. 1 is a diagram showing a typical example of energy band created in a prior-art heterojunction bipolar transistor with a compositionally graded base region.

Growing research and development efforts are being made for faster devices for use in electronic systems with an emphasis put on heterojunction bipolar transistors which can provide larger current driving capabilities in comparison with a field effect transistor. On of the heterojunction bipolar transistors of the type having a compositionally grade base region is disclosed by J. R. Hayes et al. in "BIPOLAR TRANSISTOR WITH GRADEDBAND-GAP BASE", ELECTRONIC LETTERS, 26th May 1983, vol. 19, No. 11, pages 410 to 411. The heterojunction bipolar transistor disclosed by Hayes et al. has a base region compositionally graded from $Al_{0.15}Ga_{0.85}As$ to GaAs which results in an energy band diagram similar to that illustrated in FIG. 1 of the drawings. The energy band illustrated in FIG. 1 can be divided into three sections corresponding to the emitter region, the compositionally graded base region and the collector region, respectively. The first section corresponding to the emitter region has a relatively wide bandgap, and the second section corresponding to the compositionally graded base region has a graded bandgap. Namely, the graded bandgap has at one end thereof a relatively wide bandgap allowing the second section to merge into the first section and at the other end thereof a relatively narrow bandgap allowing the second section to merge into the third section as will be seen from FIG. 1. The compositionally graded base region produces a quasi-electric field which accelerates minority carriers 1 injected from the emitter region into the compositionally graded base, and, for this reason, the minority carriers 1 are expected to pass the compositionally graded base region at an ultra-high speed. In the energy band diagram shown in FIG. 1, reference numerals 2 and 3 designate the bottom of the conduction band and the top of the valence band, respectively, and the Fermi-levels of the emitter region, the compositionally graded base region and the collector region are indicated by reference numerals 4, 5 and 6, respectively.

However, a problem is encountered in the prior-art heterojunction bipolar transistor with the compositionally graded base region in inter-valley scattering. In detail, when the base region is compositionally graded from $Al_{0.15}Ga_{0.85}As$ to GaAs, this compositional grading corresponds to an electric field of about 10 kV/cm on the assumption that the compositionally graded base has a thickness of about 150 nano-meters. This electric field results in that a large amount of inter-valley scatterings take palce in the conduction band. As a result, the minority fell short of expectation in speed up.

Figure 2:
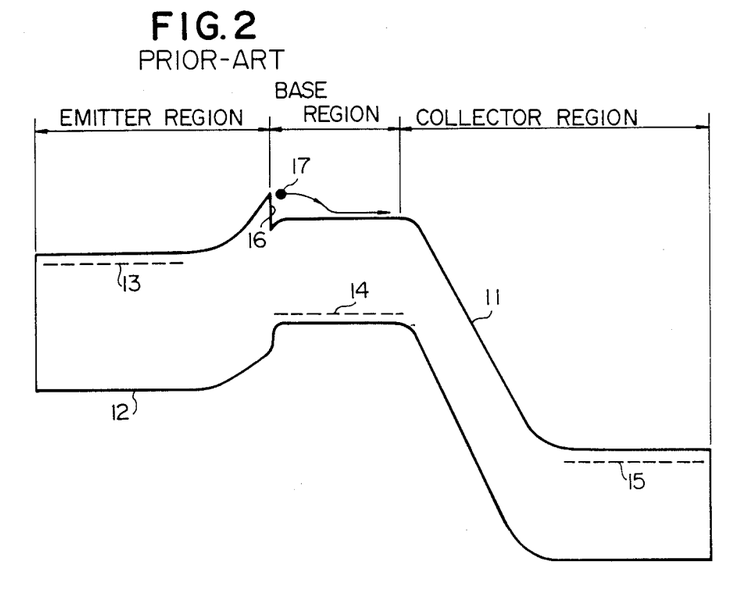
FIG. 2 is a diagram showing a typical example of energy band created in a prior-art heterojunction bipolar transistor with a ballistic operation.

One of the approaches to solve the problem in inter-valley scattering is to adopt an abrupt emitter-base heterojunction which allows the injected minority carriers to move in a ballistic or near-ballistic manner. A typical example of the heterojunction bipolar transistor with the near-ballistic operation is disclosed by D. Ankri et al. in "HIGH-SPEED GaAlAsGaAs HETEROJUNCTION BIPOLAR TRANSISTORS WITH NEAR-BALLISTIC OPERATION", ELECTRONIC LETTERS, 17th Feb. 1983, Vol. 19, No. 4, pages 147 to 149. The heterojunction bipolar transistor of the type providing the ballistic or near-ballistic operation has an energy band illustrated in FIG. 2 of the drawings. In the energy band diagram, reference numerals 11 and 12 designate the bottom of the conduction band and the top of the valence band, respecitvely, and the Fermi levels of the emitter region, the base region and the collector region are denoted by reference numerals 13, 14 and 15, respectively. As will be seen from FIG. 2, the emitter region is smaller in electron affinity than the base region but is wider in bandgap than the base region. These emitter and base regions results in a hetrojunction with an abrupt potential discontinuity 16, and the abrupt potential discontinuity 16 provides a kinetic energy corresponding to the potential gap to minority carriers, or electrons, injected from the emitter region into the base region, thereby accelerating the electrons to move in the ballistic manner.

However, another problem is encountered in the prior-art heterojunction bipolar transistor with ballistic operation in that each of the electrons terminates the ballistic movement in the initial stage of traveling over the base region. This is because of the fact that each of the electrons loses the kinetic energy at around the mean free path which is on the order of 40 nano-meters in a $p^+$-type gallium-arsenide. However, a heterojunction bipolar transistor has a base region with a thickness greater than a hundred nano-meters, so that each of the injected minority carriers are diffused in the remaining base region after termination of the ballistic movement. In order to overcome the above problem, it may be proposed to decrease the thickness of the base region within the mean free path, however the base region with a thickness of about 40 to 50 nano-meters results in a extreme large base resistance which gives rise to deterioration in device characteristics. Thus, the heterojunction bipolar transistor with the ballistic operation currently does not provide the perfect solution for the speed up.

SUMMARY OF THE INVENTION

It is therefore an important object of the present invention to provide a heterojunction bipolar transistor with a ballistic operation which operates in an ultra-high speed.

It is another important object of the present invention to provide a heterojunction bipolar transistor with a ballistic operation which allows minority carriers to move over a distance more than the mean free path in a ballistic manner.

It is still another important object of the present invention a provide a heterojunction bipolar transistor with a ballistic operation which operates at an ultra-high speed without sacrifice of the base resistance.

To accomplish these objects, the present invention proposes to provide a plurality of abrupt potential discontinuities each providing a kinetic energy to an injected minority carrier.

In accordance with the present invention, there is provided a heterojunction bipolar transistor comprising (a) an emitter region formed of a first semiconductor material of a first conductivity type, (b) a base region formed of a second semiconductor material of a second conductivity type opposite to the first conductivity type and forming a first junction together with the emitter region, and (c) a collector region formed of a third semiconductor material of the first conductivity type and forming a second junction together with the base region, wherein a plurality fo abrupt potential discontinuities including first and second abrupt potential discontinuities take palce in succession to provide kinetic energies to a carrier injected from the emitter region, respectively, and the first abrupt potential discontinuity being produced at one of the first and second junctions.

In a first implementation, the heterojunction bipolar transistor may comprises an emitter region formed of a first semiconductor material of a first conductivity type, a base region having a plurality of base areas including first and second base areas respectively formed of second and third semiconductor materials of a second conductivity type opposite to the first conductivity type, and a collector region formed of a fourth semiconductor material of the first conductivity type and forming a junction together with the base region, wherein the first and second semiconductor materials form a first heterojunction with a first abrupt potential discontinuity providing a kinetic energy to a carrier injected from the emitter region, and the second and third semiconductor materials form a second heterojunction with a second abrupt potential discontinuity providing a kinetic energy to said carrier traveling over the base region. In the first implementation, the heterojunction bipolar transistor is of the n-p-n type or of the p-n-p type. In order to form the first and second abrupt potential discontinuities, the emitter region, the first base area and the second base area may be formed of an n-type aluminum-gallium-arsenide ($Al_{0.3}Ga_{0.7}As$) doped with silicon atoms of about $1 \times 10^{19}$ cm$^{-3}$, a p-type aluminum-gallium-arsenide ($Al_{0.15}Ga_{0.85}As$) doped with beryllium atoms of about $1 \times 10^{19}$ cm$^{-3}$ and a p-type gallium-arsenide (GaAs) doped with beryllium atoms of about $1 \times 10^{19}$ cm$^{-3}$, respectively, and the first base area may have a thickness of about 50 nano-meters which is approximately equal to the mean free path of electron in the p-type aluminum-gallium-arsenide.

In a second implementation, the heterojunction bipolar transistor may comprise an emitter region formed of a first semiconductor material of a first conductivity type, a base region having a plurality of base areas including first, second and third base areas respectively formed of second, third and fourth semiconductor materials of a second conductivity type, and a collector region formed of a fifth semiconductor material of the first conductivity type and forming a junction together with the base region, wherein the first and second semiconductor materials form a first heterojunction with a first abrupt potential discontinuity providing a kinetic energy to carriers each injected from the emitter region, the second and third semiconductor materials provide a first potential barrier screening parts of the carriers each having a low kinetic energy, and the third and fourth semiconductor materials form a second heterojunction with a second abrupt potential discontinuity providing a kinetic energy to the carriers exceeding the first potential barrier, thereby cutting off the carriers not contributing to high-frequency response operation. A second potential barrier may be formed at the junction between the third base area and the collector region by means an abrupt heterojunction, and each of these potential barriers is selected to be lower in potential level than the carriers with the maximum kinetic energy arriving thereat. The heterojunction bipolar transistor with the first and second potential barriers may be formed of an n-type aluminum-gallium-arsenide ($Al_{0.25}Ga_{0.75}As$) doped with silicon atoms of about $3 \times 10^{17}$ cm$^{-3}$ for the emitter region, a p-type aluminum-gallium-arsenide ($Al_{0.1}Ga_{0.9}As$) doped with beryllium atoms of about $2 \times 10^{19}$ cm$^{-3}$ for the first base area, a p-type aluminum-gallium-arsenide ($Al_{0.15}Ga_{0.85}As$) doped with beryllium atoms of about $2 \times 10^{19}$ cm$^{-3}$ for the second base area, a p-type gallium-arsenide (GaAs) doped with beryllium atoms of about $2 \times 10^{19}$ cm$^{-3}$ for the third base area and an n-type aluminum-gallium-arsenide ($Al_{0.1}Ga_{0.9}As$) doped with silicon atoms of about $5 \times 10^{16}$ cm$^{-3}$ for the collector region, respectively, and the first, second and third base areas may have thicknesses of about 700 angstroms, 100 angstroms and 700 angstroms, respectively. The second base area may be compositionally graded so as to decrease in electron affinity from a junction between the first base area and the second base area to the second heterojunction.

In a third implementation, the heterojunction bipolar transistor may comprise an emitter region formed of a first semiconductor material of a first conductivity type, a base region having a plurality of base areas including first and second base areas respectively formed of second and third semiconductor materials of a second conductivity type opposite to the first conductivity type, each of the first and second base areas having a high impurity density section and a low impurity density section, and a collector region formed of a fourth semiconductor material of the first conductivity type and forming a junction together with the base region, wherein the first semiconductor material and the high impurity density section of the second semiconductor material form a first heterojunction with a first abrupt potential discontinuity providing a kinetic energy to a carrier injected from the emitter region, and the low impurity density section of the second semiconductor material and the high impurity density section of the third semiconductor material form a second heterojunction with a second abrupt potential discontinuity providing a kinetic energy to the carrier traveling over the base region. In order to form the first and second heterojunctions, the emitter region, the first base area and the second base area are formed of an n-type aluminum-gallium-arsenide ($Al_{0.3}Ga_{0.7}As$) doped with silicon atoms of about $3 \times 10^{17}$ cm$^{-3}$, a p-type aluminum-gallium-arsenide ($Al_{0.15}Ga_{0.85}As$) partly doped with beryllium atoms of about $1 \times 10^{20}$ cm$^{-3}$ and partly doped with beryllium atoms of about $1 \times 10^{18}$ cm$^{-3}$ and a p-type gallium-arsendie (GaAs) partly doped with beryllium atoms of about $1 \times 10^{20}$ cm$^{-3}$ and partly doped with beryllium atoms of about $1 \times 10^{18}$ cm$^{-3}$, respectively. It is preferable to select the high impurity density sections of the first and second base areas to have a thickness of about 400 angstroms which is approximately equal to the mean free path of electron.

In a fourth implementation, the heterojunction bipolar transistor may comprise an emitter region formed of a first semiconductor material of a first conductivity type, a base region of a second semiconductor material of a second conductivity type opposite to the first conductivity type, and a collector region having a plurality of collector areas including first and second collector areas formed of third and fourth semiconductor materials of the first conductivity type, wherein the second and third semiconductor materials form a first heterojunction with a first abrupt potential discontinuity providing a kinetic energy to a carrier supplied from the base region, and the third and fourth semiconductor materials form a second heterojunction with a second abrupt potential discontinuity providing a kinetic energy to the carrier traveling the collector region. In order to form the first and second abrupt discontinuities, the base region, the first collector area and the second collector area are formed of a p-type aluminum-gallium-arsenide ($Al_{0.15}Ga_{0.85}As$) doped with beryllium atoms of about $2 \times 10^{19}$ cm$^{-3}$, an n-type aluminum-gallium-arsenide ($Al_{0.075}Ga_{0.925}As$) doped with silicon atoms of about $5 \times 10^{16}$ cm$^{-3}$, an n-type gallium-arsenide (GaAs) doped with silicon atoms of about $5 \times 10^{16}$ cm$^{-3}$, respectively, and the first collector region may have a thickness of about 500 angstroms for complete ballistic operation.

BRIEF DESCRIPTION OF THE DRAWINGS

The features and advantages of a heterojunction bipolar transistor according to the present invention will be more clearly understood from the following description taken in conjunction with the accompanying drawings in which.

DESCRIPTION OF THE PREFERRED EMBODIMENTS

First Embodiment

Figure 3:
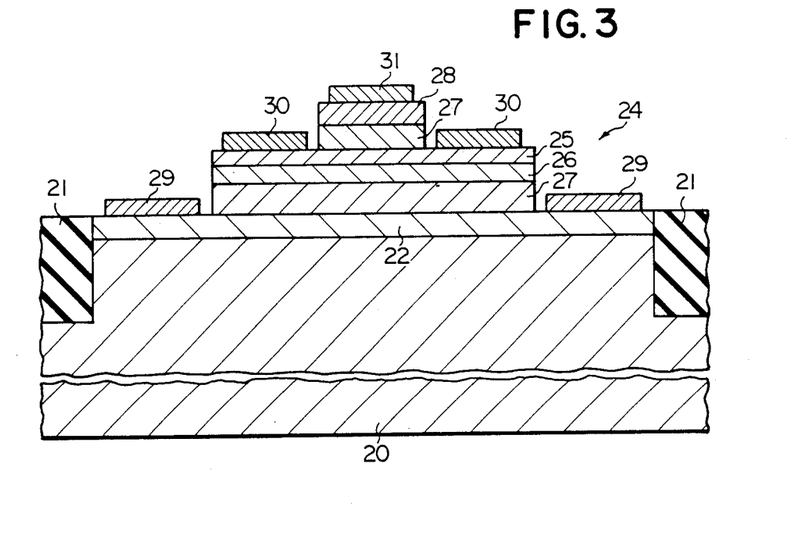
FIG. 3 is a cross sectional view showing the structure of a first embodiment of the heterojunction bipolar transistor according to the present invention.

Referring first to FIG. 3 of the drawings, the structure of a heterojunction bipolar transistor embodying the present invention is illustrated and fabricated in an active device area on a gallium-arsenide semi-insulating substrate 20 defined by an insulating region 21 formed by an implantation of protons. The heterojunction bipolar transistor illustrated in FIG. 3 largely comprises an n-type high-impurity density collector contact layer 22 of about 500 nano-meters an n-type low-impurity density collector layer 23 of about 500 nano-meters, a p-type base structure 24 consisting of a p-type first base area 25 of about 50 nano-meters and a p-type second base area 26 of about 50 nano-meters, an n-type emitter layer 27 of about 200 nano-meters, an n-type emitter cap layer 28 of about 200 nano-meters, a collector contact 29, a base contact 30 and an emitter contact 31.

The formation process starts with preparation of the semi-insulating substrate 20. On the semi-insulating substrate are successively grown a gallium-arsenide (GaAs) doped with silicon atoms of about $5 \times 10^{18}$ cm$^{-3}$ for the collector contact layer 22, a gallium-arsenide (GaAs) doped with silicon atoms of about $3 \times 10^{16}$ cm$^{-3}$ for the collector layer 23, a gallium-arsenide (GaAs) doped with beryllium atoms of about $1 \times 10^{19}$ cm$^{-3}$ for the second base area 26, an aluminum-gallium-arsenide ($Al_{0.15}Ga_{0.85}As$) doped with beryllium atoms of about $1 \times 10^{19}$ cm$^{-3}$ for the first base area 25, an aluminum-gallium-arsenide ($Al_{0.3}Ga_{0.7}As$) doped with silicon atoms of about $1 \times 10^{19}$ cm$^{-3}$ for the emitter layer 27 and a gallium-arsenide (GaAs) doped with silicon atoms of about $5 \times 10^{18}$ cm$^{-3}$ for the emitter cap layer 28 by using a molecular-beam-epitaxy.

Figure 4:
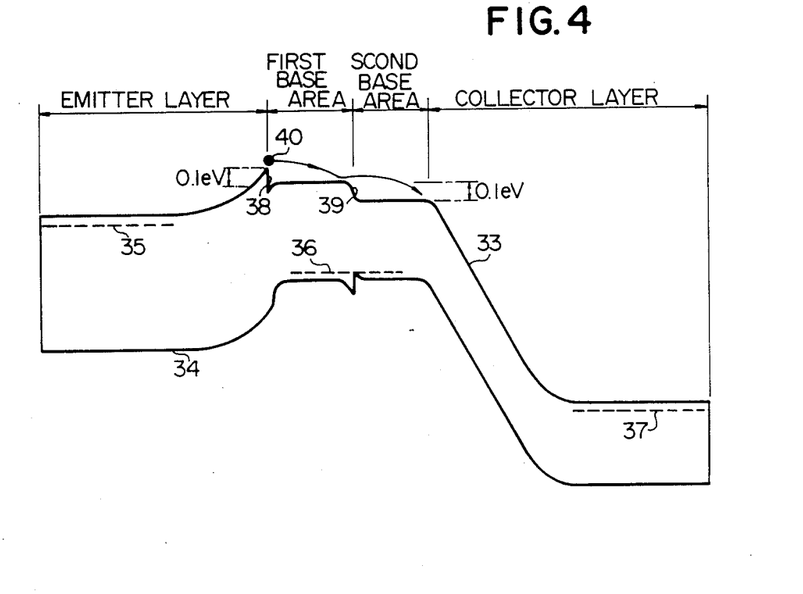
FIG. 4 is a diagram showing an energy band of the heterojunction bipolar transistor illustrated in FIG. 3.

In the heterojunction bipolar transistor is created an energy band shown in FIG. 4 in which the bottom of the conduction band and the top of the valence band are designated by reference numerals 33 and 34, respectively, and reference numerals 35, 36 and 37 denote the Fermi levels of the emitter layer 27, the base structure 24 and the collector layer 23, respectively. As will be seen from FIG. 4, a first abrupt potential discontinuity 38 takes place at a first heterojunction between the emitter layer 27 and the first base area 25 due to difference in electron affinity therebetween, and a second abrupt potential discontinuity 39 is produced at a second heterojunction between the first base area 25 and the second base area 26 due to difference in electron affinity. In this instance, each of the first and second abrupt potential discontinuities 38 and 39 has a value of about 0.1 eV and is operative to provide a kinetic energy corresponding to the energy gap of about 0.1 eV to minority carrier or an electron. For this reason, each of the electrons passing through the first heterojunction is accelerated with the kinetic energy so that the electron moves over a distance approximately equal to a mean free path of electron in a ballistic manner. The heterojunction bipolar transistor illustrated in FIG. 3 has the first base area 25 of about 50 nano-meters which is approximately equal to the mean free path of electron in therein, so that the electron terminates the ballistic movement around the second heterojunction. In the heterojunction bipolar transistor illustrated in FIG. 3 is formed the second abrupt potential discontinuity 39 which is also operative to accelerate each of the electrons. When each of the electrons is accelerated with the kinetic energy again, the electron moves over a distance approximately equal to the mean free path of electron in the ballistic manner. As the second base area 26 has the thickness of about 50 nano-meters approximately equal to the mean free path of electron, the electron terminates the ballistic movement at the junction between the second base area 26 and the collector layer 23, thereby passing through the entire base structure 24 in the ballistic manner. This means that each of the electrons moves over the base structure 24 without diffusion, so that the electron can pass through the entire base structure at an ultra-high speed. Moreover, the heterojunction bipolar transistor illustrated in FIG. 3 has the base structure 24 with the sufficient thickness, so that the base structure has a relatively low resistance. In other words, the heterojunction bipolar transistor according to the present invention can be responsive to an input signal applied to the base electrode 30 with an extremely high frequency without sacrifice of the base resistance.

Second Embodiment

Figure 5:
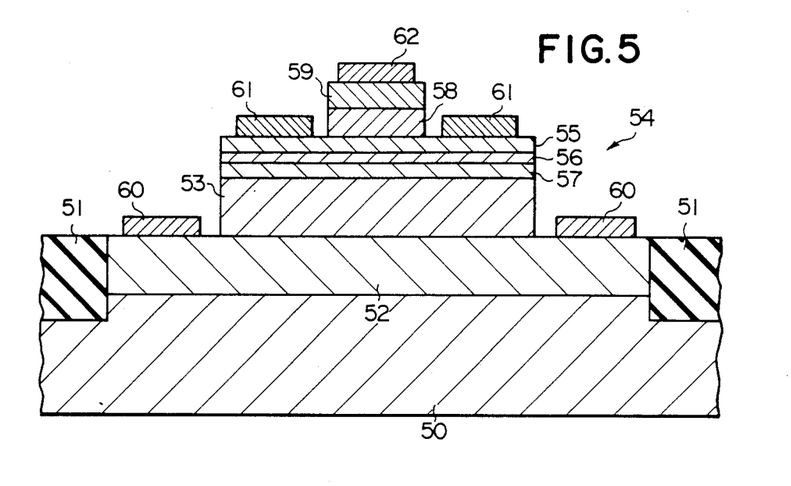
FIG. 5 is a cross sectional view showing the structure of a second embodiment of the heterojunction bipolar transistor according to the present invention.

Turning to FIG. 5 of the drawings, there is shown the structure of another heterojunction bipolar transistor embodying the present invention. The heterojunction bipolar transistor illustrated in FIG. 5 is fabricated in an active device area in a gallium-arsenide semi-insulating substrate 50 defined by an insulating region 51 formed by an implantation of protons. The heterojunction bipolar transistor illustrated in FIG. 5 largely comprises an n-type high-impurity density collector contact layer 52 of about 4000 angstroms, an n-type low-impurity density collector layer 53 of about 5000 angstroms, a p-type base structure 54 consisting of a p-type first base area 55 of about 700 angstroms, a p-type second base area 56 of about 100 angstroms and a p-type third base area 57 of about 700 angstroms, an n-type emitter layer 58 of about 2000 agnstroms, an n-type emitter cap layer 59, a collector contact 60, a base contact 61 and an emitter contact 62.

The formation process starts with preparation of the semi-insulating substrate 50. On the semi-insulating substrate 50 are successively grown a gallium-arsenide (GaAs) doped with silicon atoms of about $3 \times 10^{18}$ cm$^{-3}$ for the collector layer 52, an aluminum-gallium-arsenide ($Al_{0.1}Ga_{0.9}As$) doped with silicon atoms of about $5 \times 10^{16}$ cm$^{31\ 3}$ for the collector layer 53, a gallium-arsenide (GaAs) doped with beryllium atoms of about $2 \times 10^{19}$ cm$^{-3}$ for the third base area 57, an aluminum-gallium-arsenide ($Al_{0.15}Ga_{0.85}As$) doped with beryllium atoms of about $2 \times 10^{19}$ cm$^{-3}$ for the second base area 56, an aluminum-gallium-arsenide ($Al_{0.1}Ga_{0.9}As$) doped with beryllium atoms of about $2 \times 10^{19}$ cm$^{-3}$ for the first base area 55, an aluminum-gallium-arsenide ($Al_{0.25}Ga_{0.75}As$) doped with silicon atoms of about $3 \times 10^{17}$ cm$^{-3}$ for the emitter layer 58 and a gallium-arsenide (GaAs) doped with silicon atoms of about $5 \times 10^{18}$ cm$^{-3}$ for the emitter cap layer 59 by using a molecular-beam-epitaxy.

Figure 6:
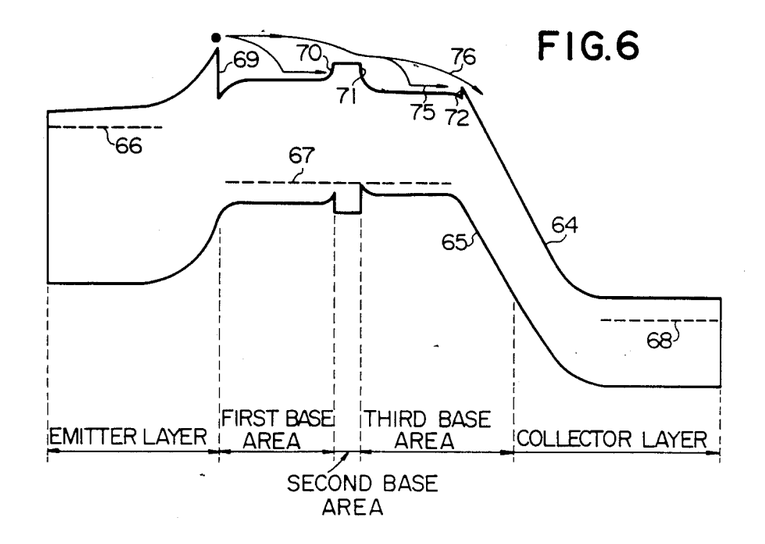
FIG. 6 is a diagram showing an energy band of the heterojunction bipolar transistor illustrated in FIG. 5.

In the heterojunction bipolar transistor is created an energy band shown in FIG. 6 in which the bottom of the conduction band and the top of the valence band are designated by reference numerals 64 and 65, respectively, and reference numerals 66, 67 and 68 denote the Fermi levels of the emitter layer 58, the base structure 54 and the collector layer 53, respectively. As will be seen from FIG. 6, a first abrupt potential discontinuity 69 takes place at a first heterojunction between the emitter layer 58 and the first base area 55 due to difference in electron affinity therebetween, and the first abrupt potential discontinuity 69 is operative to provide a kinetic energy corresponding to the first abrupt potential discontinuity to an electron passing thereover. This kinetic energy allows the electron to move over a distance approximately equal to a mean free path of electron in a ballistic or near-ballistic manner. Moreover, the first and second base areas 55 and 56 form a first potential barrier 70 which is selected to be lower in potential value than electrons with the maximum kinetic energy at the junction therebetween by a predetermined value, so that the potential barrier 70 serves in screening of electrons with low energies due to a polar-optical phonon-mode scattering during the ballistic movements in the first base area 55. In addition to the first abrupt potential discontinuity 69, the heterojunction bipolar transistor illustrated in FIG. 5 further has a second abrupt potential discontinuity 71 at a second heterojunction between the second and third base areas 56 and 57 due to difference in elctron affinity. The second abrupt potential discontinuity 71 is operative to accelerate the electrons exceeding the potential barrier 70 again for the ballistic movements over the third base area 57. Upon termination of the ballistic movement over the third base area 57, the electrons are subjected to screening with a second potential barrier 72 formed at a junction between the third base area 57 and the collector layer 53. Then, only the electrons with sufficient energies exceed the second potential barrier 72 and reach the collector electrode 60. As described in connection to the first embodiment, an electron accelerated by an abrupt potential discontinuity moves over a distance approximately equal to the mean free path of electron in the ballistic manner, so that each of the electrons injected from the emitter layer 58 terminates the ballistic movement around the junction between the first and second base areas 55 and 56, then exceeding the potential barrier 70 after screening, then moving over a distance approximately equal to the mean free path of electron in the ballistic manner again. In this manner, the electrons can travel over the entire base structure 54 in the ballistic manner because of the respective thicknesses of the first and third base areas 55 and 57 each roughly equal to the mean free path of electron. This means that each of the electrons moves over the entire base structure 54 without diffusion, so that the electron can pass through the entire base structure 54 at an ultra-high speed as similar to the first embodiment illustrated in FIG. 3. Moreover, the heterojunction bipolar transistor illustrated in FIG. 5 is improved in signal-fidelity because of the screening of electrons with low energies. Namely, the injected electrons are scattered in the polar-optical-phonon mode during the ballistic movements over the first and third base areas 55 and 57, and this results in irregularity of termination of the ballistic movements. In this situation, if all of the injected electrons are transferred into the collector layer 53, an output signal appearing at the collector electrods 60 has a waveform deviated from that of an input signal applied to the base electrode 61. However, the heterojunction bipolar transistor illustrated in FIG. 5 has the first and second potential barriers 70 and 72 for screeinging the electrons with low energies. The output signal appearing at the collector electrode 60 is conformity in waveform to the input signal applied to the base electrode 61.

Figure 7:
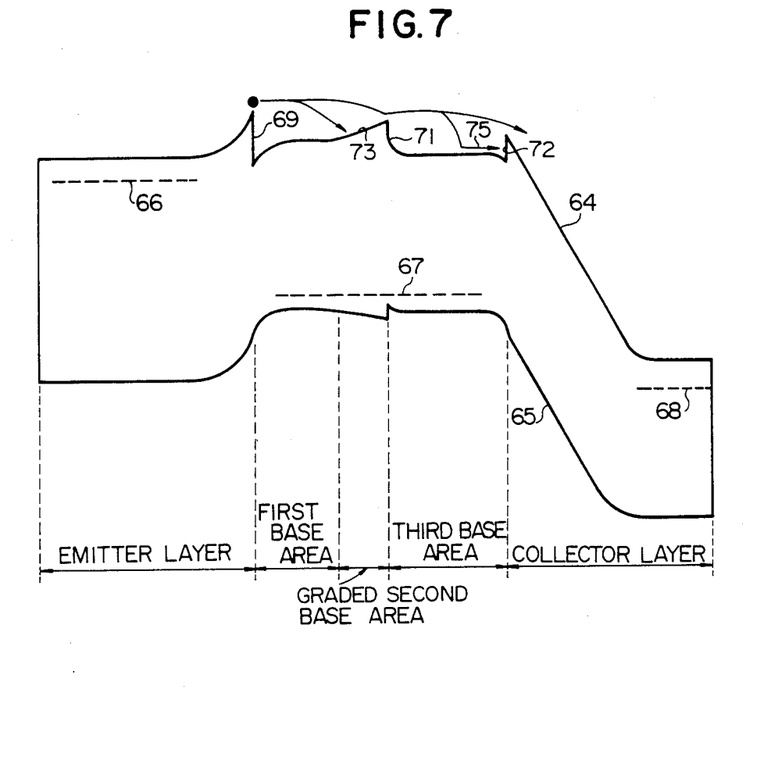
FIG. 7 is a diagram showing an energy band created in a modification of the heterojunction bipolar transistor illustrated in FIG. 5.

Turning to FIG. 7 of the drawings, an energy band diagram of a modification of the heterojunction bipolar transistor is illustrated. The modification is similar in construction to the heterojunction bipolar transistor illustrated in FIG. 5 except for the second base area, so that layers and areas corresponding to those of the heterojunction bipolar transistor illustrated in FIG. 5 are designated by like reference numerals and detailed description therefor is omitted for the sake of simplicity. The modification has a second base area compositionally graded from a p-type aluminum-gallium-arsenide ($Al_{0.1}Ga_{0.9}As$) to a p-type aluminum-gallium-arsenide ($Al_{0.15}Ga_{0.85}As$), so that the bottom of the conduction band 64 has a graded portion 73 instead of the abrupt potential gap 70. This graded portion 73 is conducive to reduction in quantum-mechanical reflection.

Third Embodiment

Figure 8:
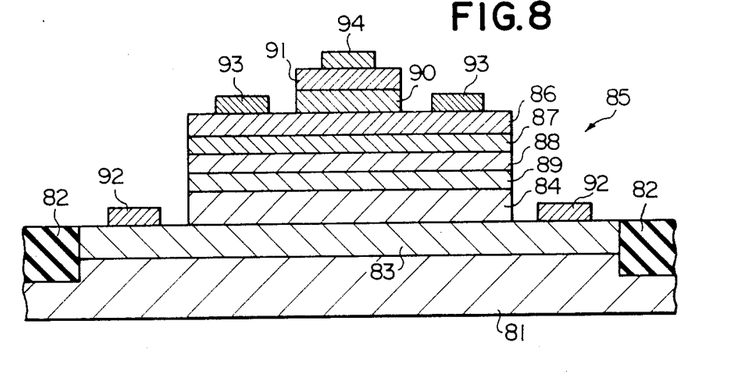
FIG. 8 is a cross sectional view showing the structure of a third embodiment of the heterojunction bipolar transistor according to the present invention.
Figure 9:
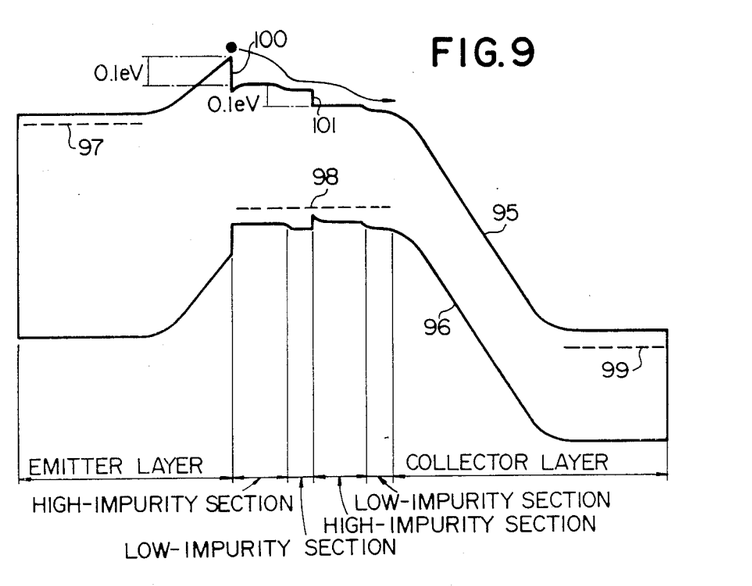
FIG. 9 is a diagram showing an energy band of the heterojunction bipolar transistor illustrated in FIG. 8.

Turning to FIG. 8 of the drawings, the structure of another heterojunction bipolar transistor embodying the present invention is illustrated and fabricated in an active device area on a gallium-arsenide semi-insulating substrate 81 defined by an insulating region 82 formed by an implantation of protons. The heterojunction bipolar transistor illustrated in FIG. 8 largely comprises an n-type high-impurity density collector contact layer 83 of about 4000 angstroms, an n-type low-impurity density collector layer 84 of about 5000 angstroms, a p-type base structure 85 consisting of a p-type first base area with a high impurity density section 86 of about 400 angstroms and a low impurity density section 87 of about 100 angstroms and a p-type second base area with a high-impurity density section 88 of about 400 angstroms and a low-impurity density section 89 of about 100 angstroms, an n-type emitter layer 90, an n-type emitter cap layer 91, a collector contact 92, a base contact 93 and an emitter contact 94.

The formation process starts with preparation of the semi-insulating substrate 81. On the semi-insulating substrate 81 are successively grown a gallium-arsenide (GaAs) doped with silicon atoms of about $3 \times 10^{18}$ cm$^{-3}$ for the collector contact layer 83, a gallium-arsenide (GaAs) doped with silicon atoms of about $5 \times 10^{16}$ cm$^{-3}$ for the collector layer 84, a gallium-arsenide (GaAs) doped with beryllium atoms of about $1 \times 10^{18}$ cm$^{-3}$ for the low-impurity density section 89 of the second base area, a gallium-arsenide (GaAs) doped with beryllium atoms of about $1 \times 10^{20}$ cm$^{-3}$ for the high-impurity density section 88 of the second base section, an aluminum-gallium-arsenide (Al$_{0.15}$Ga$_{0.85}$As) doped with beryllium atoms of about $1 \times 10^{18}$ cm$^{-3}$ for the low-impurity density section 87 of the first base area, an aluminum-gallium-arsenide (Al$_{0.15}$Ga$_{0.85}$As) doped with beryllium atoms of about $1 \times 10^{20}$ cm$^{-3}$ for the high-impurity density section 86 of the first base area, an aluminum-gallium-arsenide (Al$_{0.3}$Ga$_{0.7}$As) doped with silicon atoms of about $3 \times 10^{17}$ cm$^{-3}$ for the emitter layer 90 and a gallium-arsenide (GaAs) doped with silicon atoms of about $5 \times 10^{18}$ cm$^{-3}$ for the emitter cap layer 91 by using a molecular-beam-epitaxy.

Figure 10:
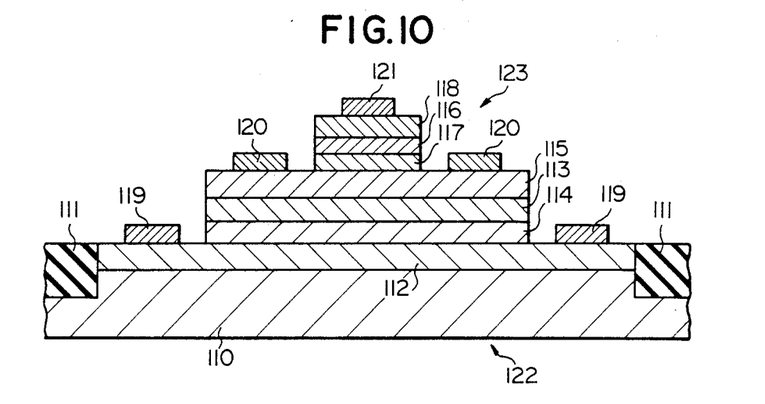
FIG. 10 is a cross sectional view showing the structure of a fourth embodiment of the heterojunction bipolar transistor according to the present invention.

In the heterojunction bipolar transistor is created an energy band shown in FIG. 10 in which the bottom of the conduction band and the top of the valence band are designated by reference numerals 95 and 96, respectively, and reference numerals 97, 98 and 99 denote the Fermi levels of the emitter layer 90, the base structure 85 and the collector layer 84, respectively. As will be seen from FIG. 10, a first abrupt potential discontinuity 100 takes place at a first heterojunction between the emitter layer 90 and the high-impurity density section 86 of the first base area due to difference in electron affinity therebetween, and a second abrupt potential discontinuity 101 is produced at a second heterojunction between the low-impurity density section 87 of the first base area and the high-impurity density section 88 of the second base area due to difference in electron affinity. Each of the first and second abrupt potential discontinuities 100 and 101 is operative to provide a kinetic energy corresponding to the potential gap to minority carrier or an electron. For this reason, each of the electrons passing through the first heterojunction is accelerated with the kinetic energy so that the electron moves over a distance approximately equal to a mean free path of electron in a ballistic manner. The heterojunction bipolar transistor illustrated in FIG. 8 has the high-impurity density section 86 of the first base area of about 400 angstroms which is roughly equal to the mean free path of electron in therein, so that the electron terminates the ballistic movement around a junction between the high-impurity density section 86 and the low-impurity density section 87. When the electrons pass through the junction between the two sections 86 and 87 of the first base area, the electrons are diffused over the low-impurity density section 87 of the first base area. However, the section 87 is reduced in impurity density in comparison with the section 86, so that most of the electrons can reach the second heterojunction without recombination. Upon termination of diffusion over the low-impurity density section 87, each of the electrons is accelerated by the second abrupt potential discontinuity 101 and, for this reason, moves over a distance approximately equal to the mean free path of electron in the ballistic manner again. As the high-impurity density section 88 of the second base area has the thickness of about 400 angstroms roughly equal to the mean free path of electron, the electron terminates the ballistic movement around a junction between the high-impurity density section 88 and the low-impurity density section 89. When the electrons pass through the junction between the sections 88 and 89 of the second base area, the electrons are diffused over the low-impurity section 88 but hardly recombine because of the low-impurity density. Although the heterojunction bipolar transistor illustrated in FIG. 8 has the sections 87 and 89 where the electrons are diffused, the transport factor is relatively high because of the low-impurity densities thereof.

Fourth Embodiment

Turning to FIG. 10 of the drawings, the structure of another heterojunction bipolar transistor embodying the present invention is illustrated and fabricated in an active device area on a gallium-arsenide semi-insulating substrate 110 defined by an insulating region 111 formed by an implantation of protons. The heterojunction bipolar transistor illustrated in FIG. 10 largely comprises an n-type high-impurity density collector contact layer 112 of about 5000 angstroms, an n-type low-impurity density first collector area 113 of about 500 angstroms, an n-type low-impurity density second collector area 114 of about 3000 angstroms, a p-type base layer 115 of about 1500 angstroms, an n-type first emitter area 116 of about 200 angstroms, an n-type second emitter area 117 of about 500 angstroms, an n-type emitter cap layer 118 of about 1000 angstroms, a collector contact 119, a base contact 120 and an emitter contact 121. The first and second collector areas 113 and 114 form in combination a collector layer 122, and the first and second emitter areas 116 and 117 form in combination an emitter layer 123.

The formation process starts with preparation of the semi-insulating substrate 110. On the semi-insulating substrate 110 are successively grown a gallium-arsenide (GaAs) doped with silicon atoms of about $5 \times 10^{18}$ cm$^{-3}$ for the collector contact layer 112, a gallium-arsenide (GaAs) doped with silicon atoms of about $5 \times 10^{16}$ cm$^{-3}$ for the second collector area 114, an n-type aluminum-gallium-arsenide (Al$_{0.075}$Ga$_{0.925}$As) doped with silicon atoms of about $5 \times 10^{16}$ cm$^{-3}$ for the first collector area 113, a aluminum-gallium-arsenide (Al$_{0.15}$Ga$_{0.85}$As) doped with beryllium atoms of about $2 \times 10^{19}$ cm$^{-3}$ for the base layer 115, an aluminum-gallium-arsenide ($Al_xGa_{1-x}As$ where x varies from 0.15 to 0.30) doped with silicon atoms of about $3\times10^{17}$ cm$^{-3}$ for the second emitter area 117, an aluminum-gallium-arsenide ($Al_{0.3}Ga_{0.7}As$) doped with silicon atoms of about $3\times10^{17}$ cm$^{-3}$ for the first emitter area 116 and a gallium-arsenide (GaAs) doped with silicon atoms of about $5\times10^{18}$ cm$^{-3}$ for the emitter cap layer 118 by using a molecular-beam-epitaxy or a metalorganic chemical-vapor deposition.

Figure 11:
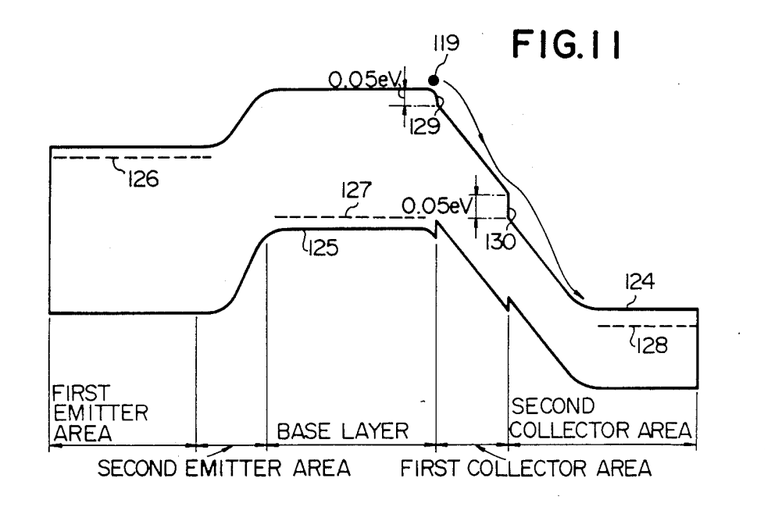
FIG. 11 is a diagram showing an energy band of the heterojunction bipolar transistor illustrated in FIG. 10.

In the heterojunction bipolar transistor is created an energy band shown in FIG. 11 in which the bottom of the conduction band and the top of the valence band are designated by reference numerals 124 and 125, respectively, and reference numerals 126, 127 and 128 denote the Fermi levels of the emitter layer 123, the base layer 115 and the collector layer 122, respectively. As will be seen from FIG. 11, a first abrupt potential discontinuity 129 takes place at a heterojunction between the base layer 115 and the first collector area 113 due to difference in electron affinity therebetween, and a second abrupt potential discontinuity 130 is produced at a heterojunction between the first collector area 113 and the second collector area 114 due to difference in electron affinity. In this instance, each of the first and second abrupt potential discontinuities 129 and 130 has a value of about 0.05 eV and is operative to provide a kinetic energy corresponding to the energy gap of about 0.05 eV to a minority carrier or an electron. For this reason, each of the electrons passing through the base-collector heterojunction is accelerated with the kinetic energy so that the electron moves over a distance approxmiately equal to a mean free path of elecron in a ballistic manner. The heterojunction bipolar transistor illustrated in FIG. 10 has the first collector area 113 of about 500 angstroms which is approximately equal to the mean free path of electron therein, so that the electron terminates the ballistic movement around the second heterojunction. In the heterojunction bipolar transistor illustrated in FIG. 10 is formed the second abrupt potential discontinuity 130 which is also operative to accelerate each of the electrons. When each of the electrons is accelerated with the kinetic energy again, the electron moves over a distance approximately equal to the mean free path of electron in the ballistic manner. As the heterojunction bipolar transistor has a depletion layer extending from the base-collector junction through the first collector area 113 into the second collector area 114, the electrons passing through the base layer 115 moves over the entire depletion layer extending in the collector layer 122 in the ballistic manner. In general, an electron needs a time period of, typically 0.7 to 1.0 pico-second so as to pass through the depletion layer extending from the base-collector junction in drift, and this time period needed to pass over the depletion layer is approximately equal to that to pass the base layer. However, the bipolar transistor illustrated in FIG. 10 has the first and second abrupt potential discontinuities 129 and 130, so that the time period for passing through the depletion layer is reduced by ballistic movements. This means that the electrons can pass through the depletion layer at an ultra-high speed.

All of the embodiments described hereinbefore are of the n-p-n type, however a p-n-p type bipolar transistor can be implemented with minority carriers of holes. Moreover, other semiconductor materials, especially compound semiconductor materials, of both lattice-matched type and lattice-mismatched type are available for formation of heterojunctions instead of the gallium-arsenide and the aluminum-gallium-arsenide. In addition to these, each of the embodiments has only two abrupt potential discontinuities, however it is possible to provide more than two abrupt potential discontinuities if the layer has a thickness twice as wide as the mean free path of electron.

Each base area or each high-impurity section of each embodiment may have a thickness ranging between 100 angstroms and 1000 angstroms. This is because of the facts that no abrupt potential discontinuity is formed if the thickness is less than 100 angstroms and that diffusion length is too long to actualize the benefit of the ballistic movement.

Althouugh particular embodiment of the present invention have been shown and described, it will be obvious to those skilled in the art that various changes and modifications may be made without departing from the spirit and scope of the present invention.

What is claimed is:

1. A heterojunction bipolar transistor comprising:
   (a) an emitter region formed of a first semiconductor material of a first conductivity type;
   (b) a base region having a plurality of base areas including first and second base areas respectively formed of second and third semiconductor materials of a second conductivity type opposite to said first conductivity type; and
   (c) a collector region formed of a fourth semiconductor material of said first conductivity type and forming a junction together with said base region, wherein said first and second semiconductor materials form a first heterojunction with a first abrupt potential discontinuity providing a first kinetic energy to a carrier injected from said emitter region, and said second and third semiconductor materials form a second heterojunction with a second abrupt potential discontinuity providing a second kinetic energy to said carrier traveling over said base region, said first, second and third semiconductor materials being different in electron affinity from one another, wherein said first and second kinetic energies respectively correspond to energy gaps between the bottom edges of the conduction bands of said first and second semiconductor materials and between the bottom edges of the conduction bands of said second and third semiconductor materials.

2. A heterojunction bipolar transistor as set forth in claim 1, in which said heterojunction bipolar transistor is of the n-p-n type.

3. A heterojunction bipolar transistor as set forth in claim 2, in which said emitter region, said first base area and said second base area are formed of an n-type aluminum-gallium-arsenide ($Al_{0.3}Ga_{0.7}As$) doped with silicon atoms of about $1\times10^{19}$ cm$^{-3}$, a p-type aluminum-gallium-arsenide ($Al_{0.15}Ga_{0.85}As$) doped with beryllium atoms of about $1\times10^{19}$ cm$^{-3}$ and a p-type gallium-arsenide (GaAs) doped with beryllium atoms of about $1\times10^{19}$ cm$^{-3}$, respectively.

4. A heterojunction bipolar transistor as set forth in claim 3, in which said first base area has a thickness of about 50 nanometers.

5. A heterojunction bipolar transistor comprising:
   (a) an emitter region formed of a first semiconductor material of a first conductivity type;
   (b) a base region having a plurality of base areas including first, second and third base areas respectively formed of second, third and fourth semiconductor materials of a second conductivity type opposite to said first conductivity type; and (c) a collector region formed of a fifth semiconductor material of said first conductivity type and forming a junction together with said base region, wherein said frist and second semiconductor materials form a first heterojunction with a first abrupt potential discontinuity providing a first kinetic energy to carriers each injected from said emitter region, said second and third semiconductor materials provide a first potential barrier screening parts of said carriers each having a low potential, and said third and fourth semiconductor materials form a second heterojunction with a second abrupt potential discontinuity providing a second kinetic energy to said carrier traveling over said potential barrier, said first, second, third and fourth semiconductor materials being different in electron affinity from one another, wherein said first and second kinetic energies respectively correspond to energy gaps between the bottom edges of the conduction bands of said first and second semiconductor materials and between the bottom edges of the conduction bands of said second and fourth semiconductor materials.

6. A heterojunction bipolar transistor as set forth in claim 5, in which said heterojunction bipolar transistor is of the n-p-n type.

7. A heterojunction bipolar transistor as set forth in claim 6, in which said first potential barrier is lower in potential level than said carriers with the maximum kinetic energy thereat.

8. A heterojunction bipolar transistor as set forth in claim 6, in which said emitter region, said first base section, said second base area and said third base area are formed of an n-type aluminum-gallium-arsenide ($Al_{0.25}Ga_{0.75}As$) doped with silicon atoms of about $3 \times 10^{17}$ cm$^{-3}$, a p-type aluminum-gallium-arsenide ($Al_{0.1}Ga_{0.9}As$) doped with beryllium atoms of about $2 \times 10^{19}$ cm$^{-3}$, a p-type aluminum-gallium-arsenide ($Al_{0.15}Ga_{0.85}As$) doped with beryllium atoms of about $2 \times 10^{19}$ cm$^{-3}$ and a p-type gallium-arsenide (GaAs) doped with beryllium atoms of about $2 \times 10^{19}$ cm$^{-3}$, respectively.

9. A heterojunction bipolar transistor as set forth in claim 8, in which said first base area has a thickness of about 700 angstroms.

10. A heterojunction bipolar transistor as set forth in claim 8, in which said second base area has a thickness of about 100 angstroms.

11. A heterojunction bipolar transistor as set forth in claim 8, in which said third base area has a thickness of about 700 angstroms.

12. A heterojunction bipolar transistor as set forth in claim 6, in which said fourth and fifth semiconductor materials form a second potential barrier screening parts of said carriers each having a low potential.

13. A heterojunction bipolar transistor as set forth in claim 12, in which said emitter region, said first base section, said second base area, said third base area and said collector region are formed of an n-type aluminum-gallium-arsenide ($Al_{0.25}Ga_{0.75}As$) doped with silicon atoms of about $3 \times 10^{17}$ cm$^{-3}$, a p-type aluminum-gallium-arsenide ($Al_{0.1}Ga_{0.9}As$) doped with beryllium atoms of about $2 \times 10^{19}$ cm$^{-3}$, a p-type aluminum-gallium-arsenide ($Al_{0.15}Ga_{0.85}As$) doped with beryllium atoms of about $2 \times 10^{19}$ cm$^{-3}$, a p-type gallium-arsenide (GaAs) doped with beryllium atoms of about $2 \times 10^{19}$ cm$^{-3}$ and an n-type aluminum-gallium-arsenide ($Al_{0.1}Ga_{0.9}As$) doped with silicon atoms of about $5 \times 10^{16}$ cm$^{-3}$, respectively.

14. A heterojunction bipolar transistor as set forth in claim 13, in which said first, second and third base areas have thicknesses of about 700 angstroms, 100 angstroms and 700 angstroms, respectively.

15. A heterojunction bipolar transistor as set forth in claim 6, in which said second base area is compositionally graded so as to decrease in electron affinity from a junction between said first and second base areas to said second heterojunction.

16. A heterojunction bipolar transistor comprising:

(a) an emitter region formed of a first semiconductor material of a first conductivity type;

(b) a base region having a plurality of base areas including first and second base areas respectively formed of second and third semiconductor materials of a second conductivity type opposite to said first conductivity type, each of said first and second areas having a high impurity density section and a low impurity density section; and (c) a collector region formed of a fourth semiconductor material of said first conductivity type and forming a junction together with said base region, wherein said first semiconductor material and the high impurity density section of said second semiconductor material form a first heterojunction with a first abrupt potential discontinuity providing a first kinetic energy to a carrier injected from said emitter region, and the low impurity density section of said second semiconductor material and the high impurity density section of said third semiconductor material form a second heterojunction with a second abrupt potential discontinuity providing a second kinetic energy to said carrier traveling over said base region, said first, second and third semiconductor materials being different in electron affinity from one another, wherein said first and second kinetic energies respectively correspond to energy gaps between the bottom edges of the conduction bands of said first semiconductor material and the high impurity density section of said second semiconductor material and between the bottom edges of the conduction bands of the low impurity density section of said second semiconductor material and the high impurity density section of said third semiconductor material.

17. A heterojunction bipolar transistor as set forth in claim 16, in which said emitter region, said first base area and said second base area are formed of an n-type aluminum-gallium-arsenide ($Al_{0.3}Ga_{0.7}As$) doped with silicon atoms of about $3 \times 10^{17}$ cm$^{-3}$, a p-type aluminum-gallium-arsendie ($Al_{0.15}Ga_{0.85}As$) and a p-type gallium-arsenide (GaAs), respectively.

18. A heterojunction bipolar transistor as set forth in claim 17, in which the high impurity density section of said second semiconductor material and the low impurity density section of said second semiconductor material are doped with beryllium atoms of about $1 \times 10^{20}$ cm$^{-3}$ and about $1 \times 10^{18}$ cm$^{-3}$, respectively.

19. A heterojunction bipolar transistor as set forth in claim 18, the high impurity density section of said second semiconductor material and the low impurity density section of said second semiconductor material have thicknesses of about 400 angstroms and 100 angstroms, respectively.

20. A heterojunction bipolar transistor as set forth in claim 17, in which the high impurity denstity section of said third semiconductor material and the low impurity density section of said third semiconductor material are doped with beryllium atoms of about $1\times 10^{20}$ cm$^{-3}$ and about $1\times 10^{18}$ cm$^{-3}$, respectively.

21. A heterojunction bipolar transistor as set forth in claim 20, the high impurity density section of said third semiconductor material and the low impurity density section of said third semiconductor material have thicknesses of about 400 angstroms and 100 angstroms, respectively.

22. A heterojunction bipolar transistor as set forth in 16, in which each of said high-impurity density sections has a thickness ranging between about 100 angstroms and about 1000 angstroms.

* * * * *

UNITED STATES PATENT AND TRADEMARK OFFICE
CERTIFICATE OF CORRECTION

PATENT NO. : 4,929,997
DATED : May 29, 1990
INVENTOR(S) : Kazuhiko HONJO and Shin-Ichi TANAKA It is certified that error appears in the above-identified patent and that said Letters Patent is hereby corrected as shown below:

Col. 2, line 10, delete "respecitvely" and insert --respectively--.

Col. 3, line 6, delete "fo" and insert --of--;

Col. 3, line 13, delete "comprises" and insert --comprise--.

Col. 7, line 33, delete "cm$^{31\ 3}$" and insert --cm$^{-3}$--.

Col. 8, line 7, delete "elctron" and insert --electron--;

Col. 8, line 49, delete "screeinging" and insert --screening--.

Col. 14, line 55, delete "arsendie" and insert --arsenide--

Signed and Sealed this

Fifth Day of November, 1991

*Attest:*

HARRY F. MANBECK, JR.

*Attesting Officer*       *Commissioner of Patents and Trademarks*